(12) United States Patent
Park et al.

(10) Patent No.: US 9,585,197 B2
(45) Date of Patent: Feb. 28, 2017

(54) SEMICONDUCTOR DEVICE INCLUDING ASYMMETRIC ELECTRODE ARRANGEMENT

(71) Applicant: Samsung Electronics Co., Ltd., Suwon-si, Gyeonggi-do (KR)

(72) Inventors: Chin-sung Park, Yongin-si (KR); Won-seok Chung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 314 days.

(21) Appl. No.: 14/213,030

(22) Filed: Mar. 14, 2014

(65) Prior Publication Data

US 2015/0053666 A1  Feb. 26, 2015

(30) Foreign Application Priority Data

Aug. 20, 2013  (KR) ........................ 10-2013-0098611

(51) Int. Cl.
*H05B 3/02* (2006.01)
*H05B 3/26* (2006.01)
(Continued)

(52) U.S. Cl.
CPC ............. *H05B 3/265* (2013.01); *H01L 24/06* (2013.01); *H01L 24/14* (2013.01); *H01L 24/17* (2013.01); *H01L 24/81* (2013.01); *H05B 3/143* (2013.01); *H01L 24/16* (2013.01); *H01L 2224/0401* (2013.01); *H01L 2224/061* (2013.01); *H01L 2224/0612* (2013.01); *H01L 2224/06151* (2013.01); *H01L 2224/06155* (2013.01); *H01L 2224/06165* (2013.01); *H01L 2224/141* (2013.01); *H01L 2224/1412* (2013.01);
(Continued)

(58) Field of Classification Search
CPC ......... H01L 24/09; H01L 24/06; H01L 24/14; H01L 24/17; H01L 24/81; H01L 24/16; H01L 2224/0916; H01L 2224/16225; H01L 2224/81129; H01L 2224/81127; H01L 2224/81123; H01L 2224/81125; H01L 2224/81192; H01L 2224/1717; H01L 2224/16245; H01L 2224/162227; H01L 2224/1412; H01L 2224/0401; H01L 2224/14151; H01L 2224/14155; H01L 2224/14165; H01L 2224/17104; H01L 2224/171; H01L 2224/061; H01L 2224/0612; H01L 2224/06151; H01L 2224/06155; H01L 2224/06165; H01L 2224/141; H05B 3/265; H05B 3/143; H05B 2203/002; H05B 2203/223; H05B 2203/013; H05B 2203/016; H05B 2203/037

See application file for complete search history.

(56) References Cited

U.S. PATENT DOCUMENTS

2003/0183931 A1  10/2003  Isobe
2012/0052531 A1   3/2012  Chung et al.
2013/0063415 A1*  3/2013  Shenoy ............... B81C 1/00238
                                              345/418

FOREIGN PATENT DOCUMENTS

JP   07-167885 A    7/1995
JP   2004-253695 A  9/2004

* cited by examiner

*Primary Examiner* — Shawntina Fuqua
(74) *Attorney, Agent, or Firm* — Leydig, Voit & Mayer, Ltd.

(57) ABSTRACT

Provided is a semiconductor device including an asymmetric electrode arrangement in which a plurality of electrodes are arranged asymmetrically in a vertical or horizontal direction.

11 Claims, 7 Drawing Sheets

(51) Int. Cl.
*H05B 3/14* (2006.01)
*H01L 23/00* (2006.01)

(52) U.S. Cl.
CPC .............. *H01L 2224/14151* (2013.01); *H01L 2224/14155* (2013.01); *H01L 2224/14165* (2013.01); *H01L 2224/16225* (2013.01); *H01L 2224/16227* (2013.01); *H01L 2224/16245* (2013.01); *H01L 2224/171* (2013.01); *H01L 2224/1712* (2013.01); *H01L 2224/17104* (2013.01); *H01L 2224/81123* (2013.01); *H01L 2224/81125* (2013.01); *H01L 2224/81127* (2013.01); *H01L 2224/81129* (2013.01); *H01L 2224/81192* (2013.01); *H01L 2924/15153* (2013.01); *H05B 2203/002* (2013.01); *H05B 2203/003* (2013.01); *H05B 2203/013* (2013.01); *H05B 2203/016* (2013.01); *H05B 2203/037* (2013.01)

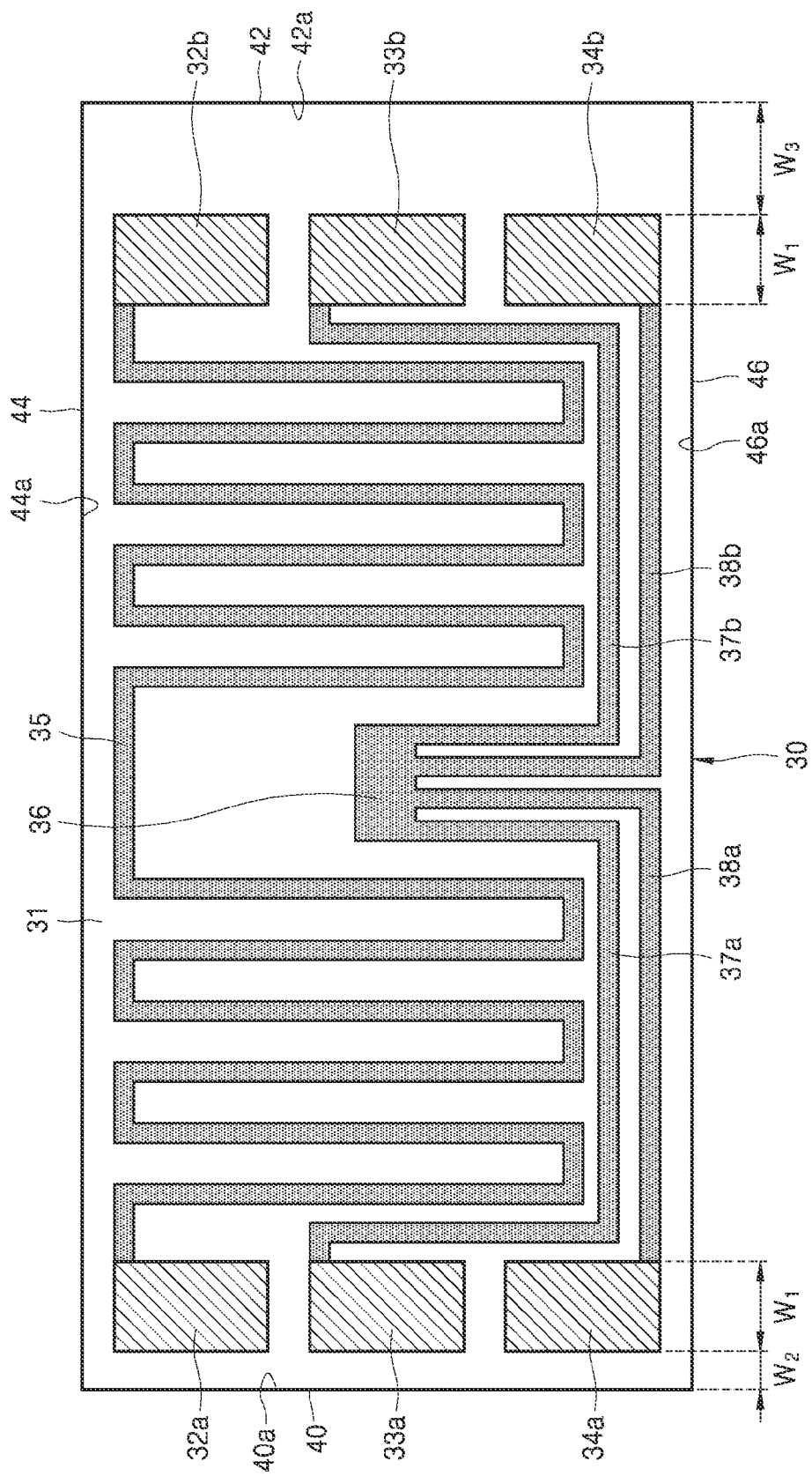

SEMICONDUCTOR DEVICE INCLUDING ASYMMETRIC ELECTRODE ARRANGEMENT

CROSS-REFERENCE TO RELATED PATENT APPLICATION

This application claims the benefit of Korean Patent Application No. 10-2013-0098611, filed on Aug. 20, 2013, in the Korean Intellectual Property Office, the entire disclosure of which is hereby incorporated by reference.

BACKGROUND OF THE INVENTION

1. Field of the Invention

The present disclosure relates to a semiconductor device including an asymmetric electrode arrangement in which a plurality of electrodes are asymmetrically arranged in a vertical or horizontal direction.

2. Description of the Related Art

Chip-type semiconductor devices using silicon or compound semiconductors that are manufactured into various electronic components have been widely used. A plurality of semiconductor devices that are formed on wafers are conventionally diced into a symmetrical shape like a rectangle. The rectangular shape is chosen due to a limitation of a dicing method and manufacturing costs. Subsequent to the dicing process, each of the diced semiconductor devices may be assembled in a package or directly installed on a system without packaging.

When a semiconductor device is assembled into a package, electrical connections between a plurality of electrodes arranged on a surface of the semiconductor device and electrodes of package components (e.g. lead frames) should be accurate in order for the semiconductor device to properly operate. If the electrodes of a semiconductor device and the electrodes of a package component are not accurately connected with each other, the semiconductor device or the system the semiconductor device is integrated into may be damaged. For instance, an expensive system on which the semiconductor device is mounted may be harmed where the system uses a high voltage and a high current if an accurate connection of the electrodes is not achieved during integration of the semiconductor device.

In instances where a semiconductor device is mounted on a system without any other packaging components, the semiconductor device should be mounted more accurately. This is because the semiconductor devices are manufactured in a symmetric shape like a rectangle, and the semiconductor devices with a symmetric shape, such as a rectangle, may easily be inverted in a vertical or horizontal direction while mounting the semiconductor device. Where the semiconductor device is mounted in an inverted condition, the electrical connection between the electrodes of the semiconductor device and the electrodes of the system may be inaccurate, which may cause a short electric circuit in the system and thereby increase the potential to damage the overall system.

SUMMARY OF THE INVENTION

According to an example embodiment, there is provided a semiconductor device including a semiconductor structure configured to perform a predetermined function; and a plurality of electrodes arranged on the semiconductor structure, wherein the plurality of electrodes are asymmetrically arranged in at least one of a first direction and a second direction perpendicular to the first direction.

The semiconductor device may have a rectangular shape having a first side and a second side, which face each other in the first direction, and a third side and a fourth side, which face each other in the second direction.

The plurality of electrodes may include a plurality of first electrodes arranged along an edge of the first side, and a plurality of second electrodes arranged along an edge of the second side.

A gap between an edge of the second side and the plurality of second electrodes may be greater than a sum of a width of one of the first electrodes and a gap between the first electrodes and the edge of the first side.

The plurality of electrodes may include the plurality of first electrodes that are arranged along the edge of the first side and a plurality of third electrodes that are arranged along an edge of the third side.

A gap between an electrode of the plurality of third electrodes that is closest to the second side and the edge of the second side may be greater than a sum of a width of one of the first electrodes and a gap between the plurality of first electrodes and the edge of the first side.

In addition, a gap between an electrode of the plurality of first electrodes that is closest to the fourth side and an edge of the fourth side may be greater than a sum of the width of one of the third electrodes and a gap between the plurality of third electrodes and the edge of the third side.

According to another embodiment, the plurality of electrodes may be arranged in at least two lines along an edge of any one side of the first side to the fourth side.

The plurality of electrodes may include: the plurality of first electrodes arranged along the edge of the first side; the plurality of second electrodes arranged along the edge of the second side; the plurality of third electrodes arranged along the edge of the third side; and the plurality of fourth electrodes arranged along the edge of the fourth side.

A gap between the edge of the second side and the plurality of second electrodes may be greater than a sum of the width of one of the plurality of first electrodes and a gap between the plurality of first electrodes and the edge of the first side, and a gap between the edge of the fourth side and the plurality of fourth electrodes may be greater than a sum of the width of one of the plurality of third electrodes and a gap between the plurality of third electrodes and the edge of the third side.

Also, the plurality of third electrodes and the plurality of fourth electrodes may be arranged not to directly face each other.

For example, the semiconductor device may include a microheater that includes: first, third and fifth electrodes arranged along the edge of the first side on the semiconductor structure; second, fourth and sixth electrodes arranged along the edge of the second side on the semiconductor structure; a metal thermal line connected between the first electrodes and the second electrodes in a zigzag pattern; a variable resistive element positioned around a center of the semiconductor structure; a first wiring connected between the third electrodes and the variable resistive element; a second wiring connected between the fourth electrodes and the variable resistive element; a third wiring connected between the fifth electrodes and the variable resistive element; and a fourth wiring connected between the sixth electrodes and the variable resistive element.

In this case, a gap between the edge of the second side and the second, fourth and sixth electrodes may be greater than a sum of a width of one of the first, third and fifth electrodes and a gap between the edge of the first side and the first, third and fifth electrodes.

BRIEF DESCRIPTION OF THE DRAWINGS

The above and other features and advantages of the present disclosure will become more apparent by describing in detail exemplary embodiments thereof with reference to the attached drawings in which:

FIG. 4 is a schematic view illustrating an arrangement of a microheater manufactured into a semiconductor chip, according to an example embodiment; and FIGS. 5A to 8B are schematic views illustrating electrode arrangements according to various embodiments, in which FIGS. 5A, 6A, 7A and 8A illustrate cases when a semiconductor device is accurately mounted on a system, and FIGS. 5B, 6B, 7B and 8B illustrate cases when a semiconductor device is inaccurately mounted on a system.

DETAILED DESCRIPTION OF THE INVENTION

Figure 1:
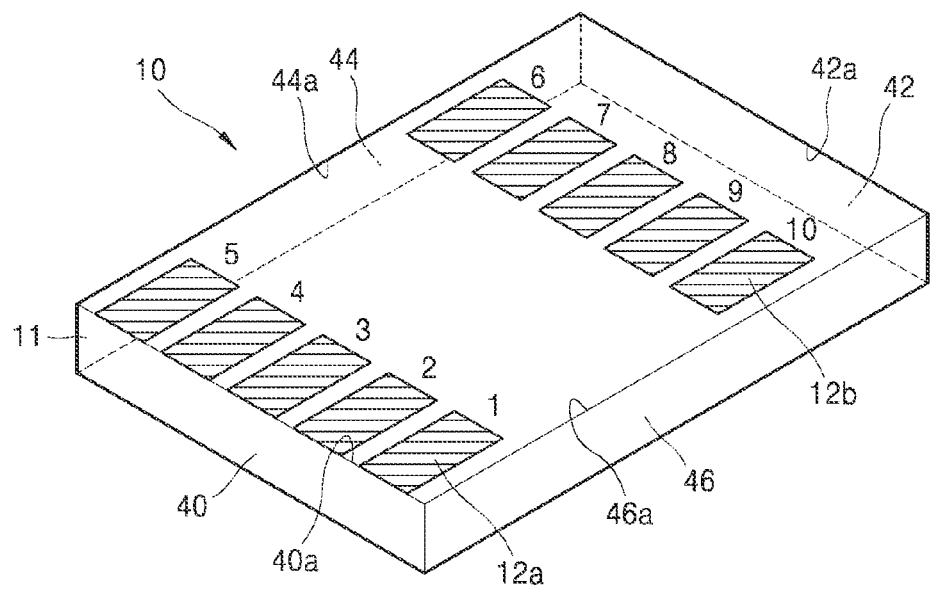
FIG. 1 is a schematic view illustrating an electrode arrangement of a semiconductor device, according to an example embodiment.

Hereinafter, a semiconductor device including an asymmetric electrode arrangement will be described in detail with reference to the attached drawings. Like reference numerals refer to the like elements throughout, and in the drawings, sizes of elements are exaggerated for clarity and convenience. Also, the present embodiments may have different forms and should not be construed as being limited to the descriptions set forth herein. It will also be understood that when a layer is referred to as being "on" another layer or substrate, it can be directly on the other layer or substrate, or intervening layers may also be present.

FIG. 1 is a schematic view illustrating an electrode arrangement of a semiconductor device, according to an example embodiment. Referring to FIG. 1, a semiconductor device 10 includes a semiconductor structure 11 configured to perform a predetermined function and a plurality of electrodes 12a and 12b arranged on the semiconductor structure 11. The semiconductor structure 11 may have any structure that may be formed on a wafer by using any general semiconductor manufacturing process. For example, the semiconductor structure 11 may be designed according to various uses of the semiconductor structure 11. A non-limiting list of examples uses of the semiconductor structure may be a memory, wireless communication, data communication, an amplifier, a modulator, a sensor, and a light emitting device, and the use and structure thereof are not limited thereto.

The electrodes 12a and 12b may be formed on an upper surface of the semiconductor structure 11 for an electric connection with an apparatus on which the semiconductor device 10 is to be mounted. Ten (10) electrodes, for example, are illustrated in FIG. 1 as the electrodes 12a and 12b, but the number of the electrodes 12a and 12b may vary according to the use and design of the semiconductor device 10. In FIG. 1, Arabic numbers from 1 to 10 that are marked next to the electrodes 12a and 12b are examples of identification numbers for the electrodes 12a and 12b.

According to the embodiment illustrated in FIG. 1, the electrodes 12a and 12b may be arranged asymmetrically in a horizontal direction of the semiconductor device 10. For example, the electrodes 12a and 12b may be respectively arranged at the left side 40 and the right side 42 of the semiconductor device 10. The electrodes 12a at the left side 40 may be arranged to adjoin a left side 40 edge 40a, whereas the electrodes 12b at the right side 42 may be arranged such that they are separated by a predetermined distance from a right side 42 edge 42a.

Figure 2:
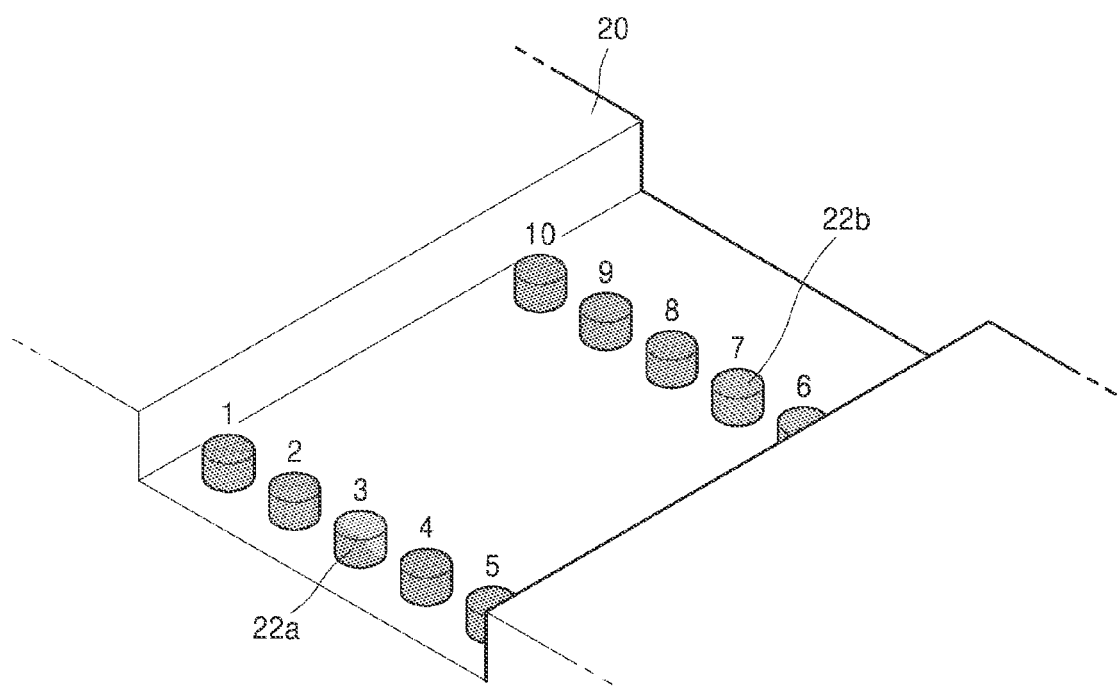
FIG. 2 is a schematic view of an arrangement of electrode pads of a system on which the semiconductor device of FIG. 1 is to be mounted.

Meanwhile, electrode pads may be arranged corresponding to the electrodes 12a and 12b of the semiconductor device 10 on a system on which the semiconductor device 10 is mounted. For instance, FIG. 2 illustrates an example of an arrangement of electrode pads 22a and 22b on a system 20 on which the semiconductor device 10 of FIG. 1 is mounted. The system 20 may be a portion of a circuit board in an electronic apparatus or a lead frame of a semiconductor chip package or any other structure capable of supporting the semiconductor device 10. As shown in FIG. 2, the electrode pads 22a on the left side 40 and the electrode pads 22b on the right side 42 may be arranged asymmetrically in the horizontal direction corresponding to the electrodes 12a and 12b of the semiconductor device 10.

Figure 3A:
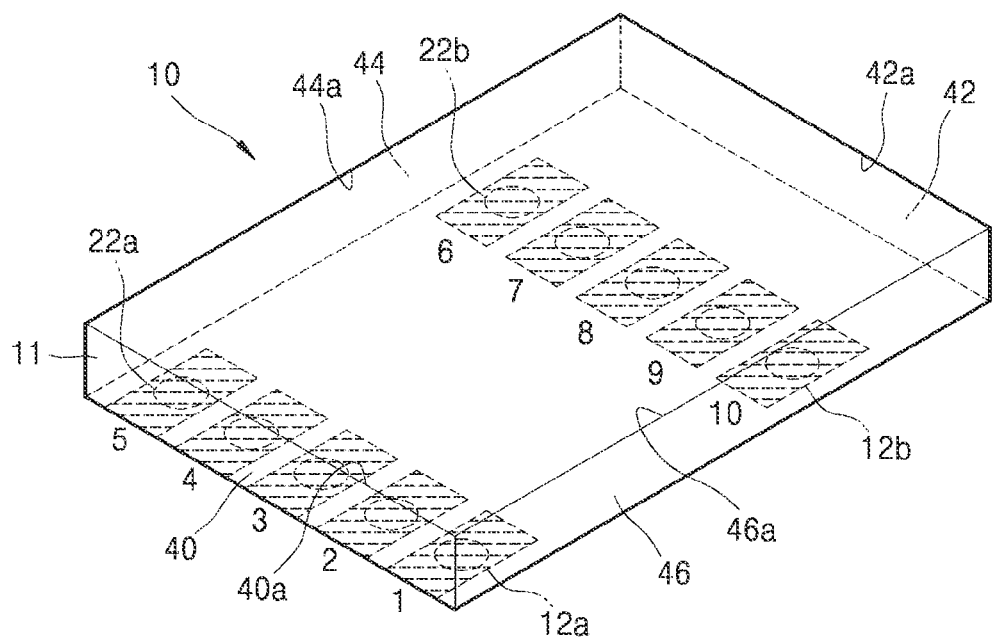
FIG. 3A is a schematic view illustrating a case in which a semiconductor device is accurately mounted on a system.

Accordingly, as illustrated in FIG. 3A, when the semiconductor device 10 is flipped to make the electrodes 12a and 12b face downwards and the semiconductor device 10 is accurately mounted on the system 20 in the horizontal direction, the electrodes 12a and 12b of the semiconductor device 10 and the electrode pads 22a and 22b of the system 20 accurately contact each other.

Figure 3B:
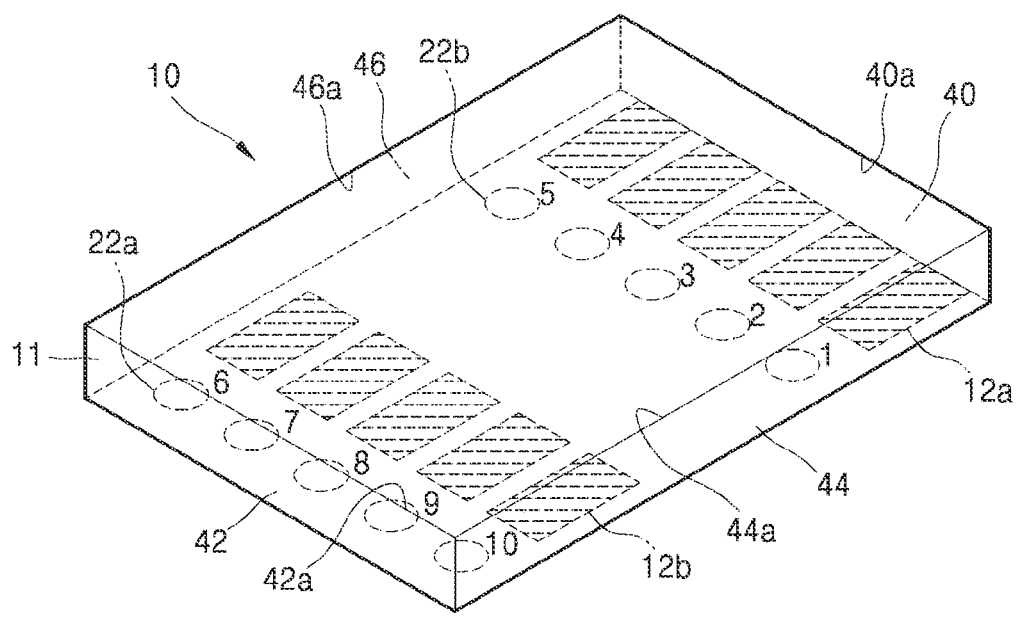
FIG. 3B is a schematic view illustrating a case in which a semiconductor device is inaccurately mounted on a system.

However, due to a limitation in a dicing method and manufacturing costs, the semiconductor device 10 is manufactured symmetrically in the horizontal direction like a square or a rectangle and thus the semiconductor device 10 may be mounted on the system 20 with the left and right sides 40, 42 of the semiconductor device 10 inversed. If the semiconductor device 10 is inaccurately mounted in the system 20, as illustrated in FIG. 3B, the electrodes 12a and 12b of the semiconductor device 10 and the electrode pads 22a and 22b of the system 20 are not matched with each other such that they do not contact each other. Therefore, if the semiconductor device 10 is inaccurately mounted on the system 20, the semiconductor device 10 and the system 20 are not electrically connected.

When the electrodes 12a and 12b of the semiconductor device 10 are asymmetrically arranged in a vertical or horizontal direction, a direction to mount the semiconductor device 10 may be easily identified so that a possibility of mounting the semiconductor device 10 inaccurately on the system 20 may become decreased. In addition, when the semiconductor device 10 is inaccurately mounted on the system 20, the semiconductor device 10 is not electrically connected to the system 20 and thus damage to the system 20 due to a short circuit caused in the system 20 during operation may be prevented.

FIG. 4 is a schematic view illustrating an arrangement of a microheater 30 manufactured as a semiconductor chip, according to an example embodiment. The microheater 30 is a semiconductor device that is mounted on a polymerase chain reaction (PCR) system that may perform a genetic analysis by amplifying DNA to control a temperature of a reaction chamber in the PCR system at high speed and measure the temperature in real time. In typical PCR systems, temperature is controlled using a peltier device, IR, and air; however, using these techniques the temperature change is slow. Therefore, to improve the temperature change time a thin-film heater such as microheater 30 is used. In certain embodiments, Microheater 30 comprises a semiconductor substrate 31 with a platinum thin film disposed thereon in order to achieve high speed temperature cycling.

Referring to FIG. 4, the microheater 30 may include a plurality of electrodes 32a, 32b, 33a, 33b, 34a and 34b that are arranged at the left and rights sides of a semiconductor substrate 31. Also, the microheater 30 may further include a metal thermal line 35 connected between a first electrode 32a and a second electrode 32b in a zigzag pattern; a variable resistive element 36 arranged around a center of the semiconductor substrate 31; a first wiring 37a connected between a third electrode 33a and the variable resistive element 36; a second wiring 37b connected between a fourth electrode 33b and the variable resistive element 36; a third wiring 38a connected between a fifth electrode 34a and the variable resistive element 36; and a fourth wiring 38b connected between a sixth electrode 34b and the variable resistive element 36.

When a voltage is applied to the first electrode 32a and the second electrode 32b, a current flows in the thermal line 35 and heat is generated. The variable resistive element 36 is formed of a material having resistance that varies according to a temperature, and functions to measure a temperature together with the third to sixth electrodes 33a, 33b, 34a, and 34b. For example, the variable resistive element 36 may be formed of at least one of Pt, Ni, and Cu. The third and fourth electrodes 33a and 33b may apply a bias voltage to the variable resistive element 36, and the fifth and sixth electrodes 34a and 34b may detect a change in the resistance of the variable resistive element 36 to sense the temperature thereof.

In the case of the microheater 30 described above and other similar microheaters used in PCR systems, for example, to achieve a rapid temperature increase of about 30° C./s, a very high current such as 10 amperes, may flow in the metal thermal line 35 of the microheater 30. If the microheater 30 were inadvertently mounted in the horizontal direction of on the PCR system such that the high current flows through the fifth and sixth electrodes 34a and 34b, then an over current may flow in the PCR system. In the event of the over current condition, the high current flowing through the variable resistive element 36 of the microheater 30 will damage the PCR system, which will require the microheater 30 to be repaired or replaced and thereby increase an expense of the PCR system.

To prevent the above risk, as illustrated in FIG. 4, the electrodes 32a, 32b, 33a, 33b, 34a, and 34b of the microheater 30 may be arranged asymmetrically on the semiconductor substrate 31 in the horizontal direction. For example, assuming that a width of each of the electrodes 32a, 32b, 33a, 33b, 34a, and 34b is W1, a gap between the electrodes 32a, 33a, and 34a on the left side 40 and a left edge 40a of the semiconductor substrate 31 is W2, and a gap between the electrodes 32b, 33b, and 34b on the right side 42 and a right edge 42a of the semiconductor substrate 31 is W3, a condition that W3>W1+W2 may be satisfied. If the condition is satisfied, the microheater 30 and the PCR system will not be electrically connected when the microheater 30 is mounted with the left and right sides 40, 42 of the microheater 30 being switched. In this manner, the above described over current condition is avoided.

In the above description, the electrodes 12a and 12b of the semiconductor device 10 of FIG. 1 and the electrodes 32a, 32b, 33a, 33b, 34a, and 34b of the microheater 30 from FIG. 4 are arranged asymmetrically in the horizontal direction, but a variety of asymmetric arrangements may be embodied according to designs (see FIGS. 5A to 8B). For example, the electrodes may be arranged asymmetrically in a vertical direction instead of the horizontal direction, or in both directions. The electrodes may be arranged asymmetrically along a diagonal direction or a random direction. Hereinafter, the terms, "left side 40", "right side 42", "upper side 44", and "lower side 46", indicate four sides (respectively, a first side 40, a second side 42, a third side 44 and a fourth side 46) of the semiconductor device 10 (see FIGS. 1, 3A, 3B and 5A to 8B) or microheater 30 (see FIG. 4) on the basis of locations on the drawings, for convenience of explanation. The directions may be changed according to the arrangement of the semiconductor device 10. The left side 40 and the right side 42 are two sides facing each other along a first direction, and the upper side 44 and the lower side 46 are two sides facing each other along a second direction perpendicular to the first direction.

FIGS. 5A to 8B are schematic views of electrode arrangements of the semiconductor device 10 according to various embodiments. FIGS. 5A, 6A, 7A and 8A illustrate cases when the semiconductor device 10 is accurately mounted on the system 20, and FIGS. 5B, 6B, 7B and 8B illustrate cases when the semiconductor device 10 is inaccurately mounted on the system 20.

Figure 5A:
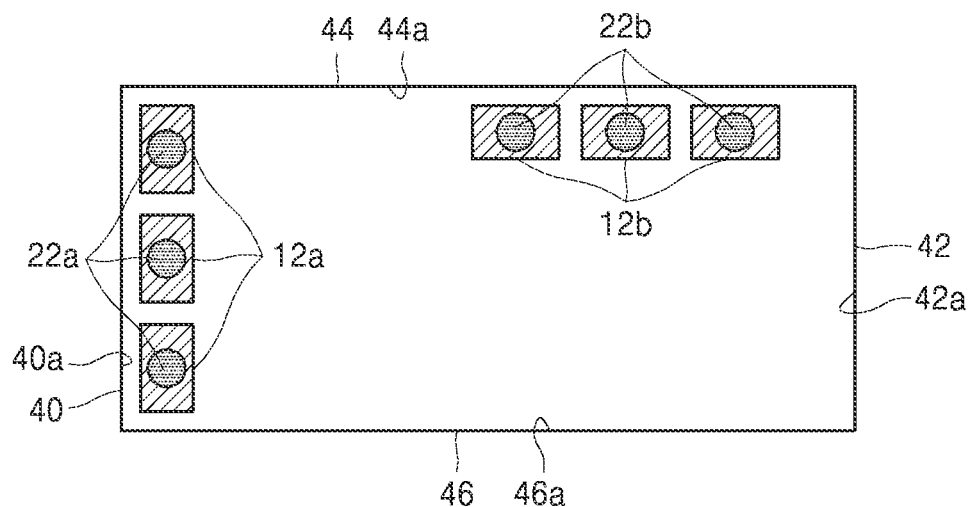
Figure 5B:
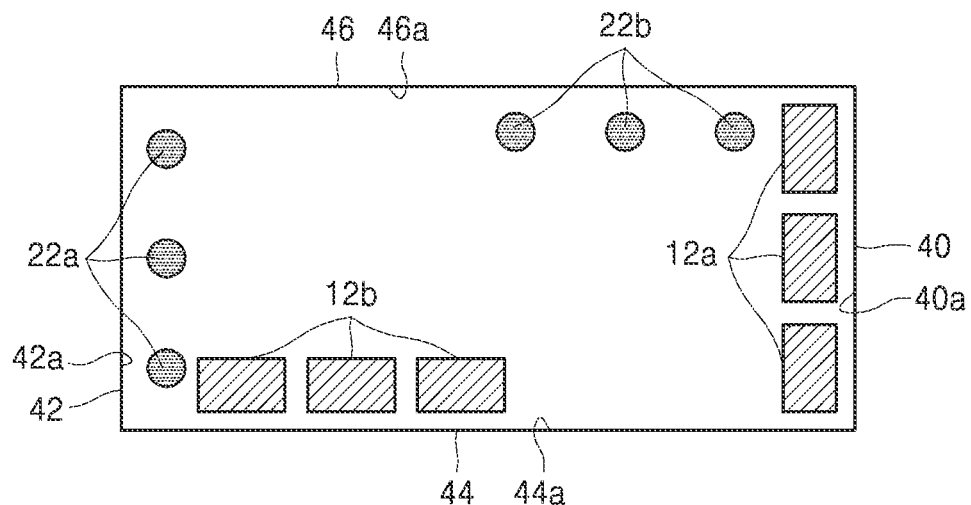

Referring to FIG. 5A, the electrodes 12a are arranged adjacent to the left side 40 edge 40a of the semiconductor device 10, and the electrodes 12b may be arranged adjacent to an edge 44a of an upper side 44. The rightmost electrode of the electrodes 12b adjacent to the upper side 44 edge 44a may be separated by a predetermined distance from the right side 42 edge 42a. For example, a gap between the rightmost electrode of the electrodes 12b adjacent to the upper side 44 and the right side 42 edge 42a may be greater than a sum of a width of each of the left electrodes 12a and a gap between the left electrodes 12a and the left side 40 edge 40a. In this case, as illustrated in FIG. 5A, if the semiconductor device 10 is accurately mounted, the electrodes 12a and 12b may be accurately connected to the electrode pads 22a and 22b of the system 20. However, as illustrated in FIG. 5B, if the semiconductor device 10 is inaccurately mounted on the system 20, the locations of the electrodes 12a and 12b and electrode pads 22a and 22b are inconsistent with each other, thereby preventing contact with each other.

Figure 6A:
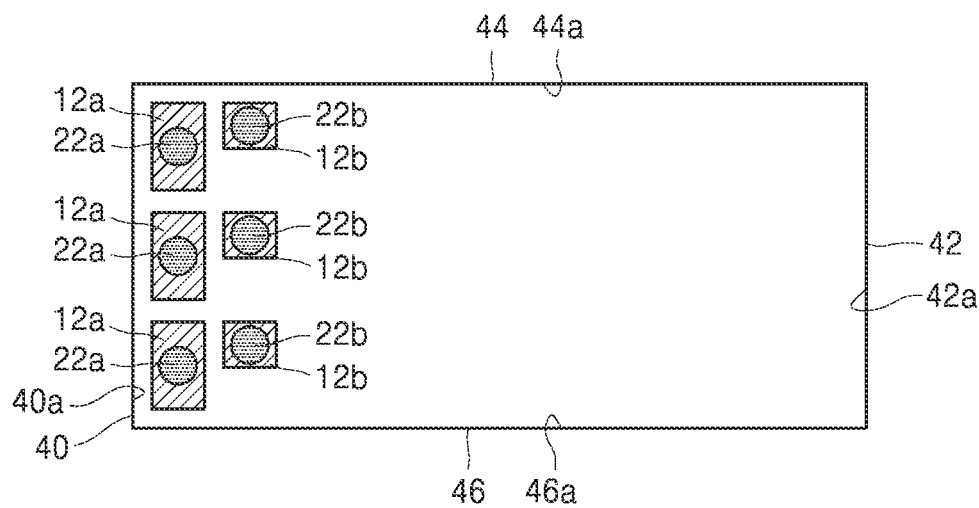
Figure 6B:
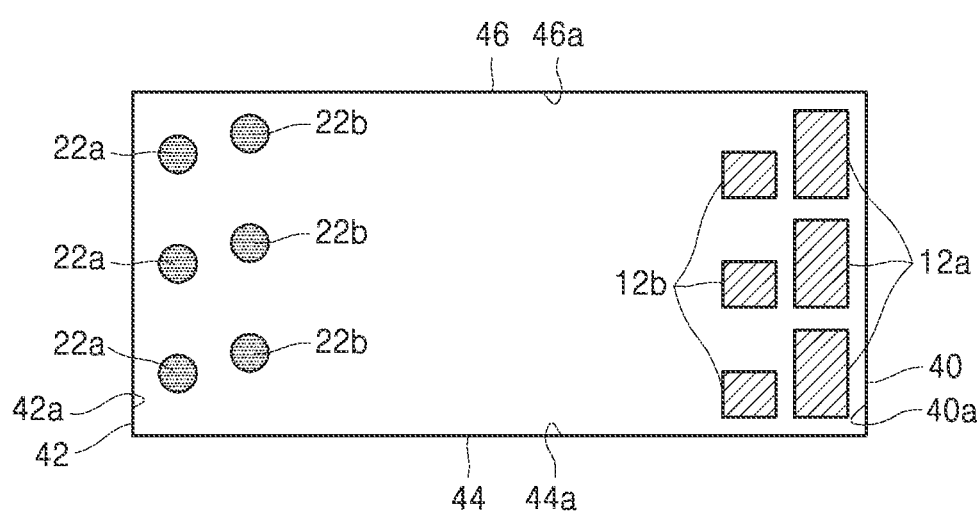

Referring to FIG. 6A, the electrodes 12a and 12b may be arranged only on the left side 40 edge 40a of the semiconductor device 10. In FIG. 6A, the electrodes 12a and 12b are arranged in two lines. However, the electrodes 12a and 12b may be arranged along one line, or along more than three lines. Also, the electrodes 12a and 12b may be arranged on the right side 42 edge 42a only. In this case, if the semiconductor device 10 is inaccurately mounted on the system 20, the electrodes 12a and 12b do not contact with the electrode pads 22a and 22b because the electrodes 12a and 12b and the electrode pads 22a and 22b are arranged on two opposite sides as illustrated in FIG. 6B.

Figure 7A:
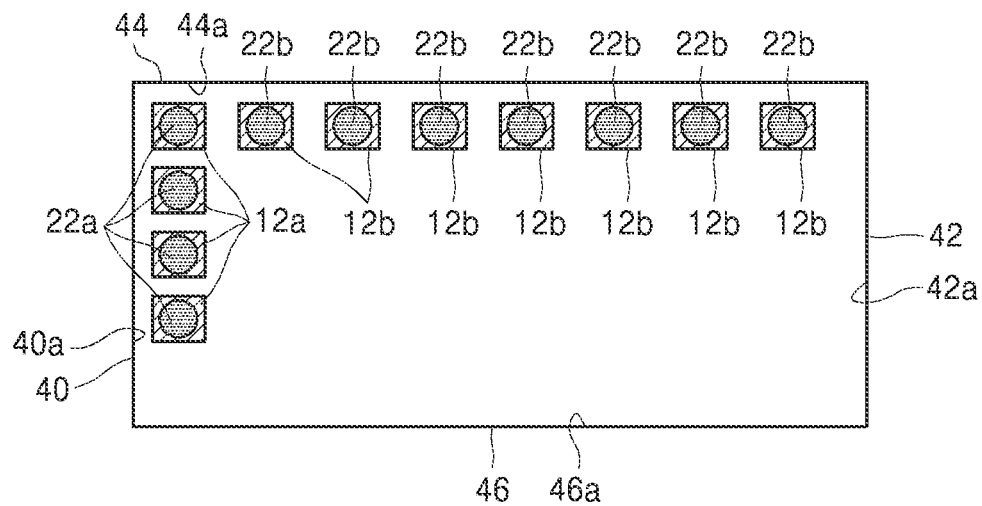
Figure 7B:
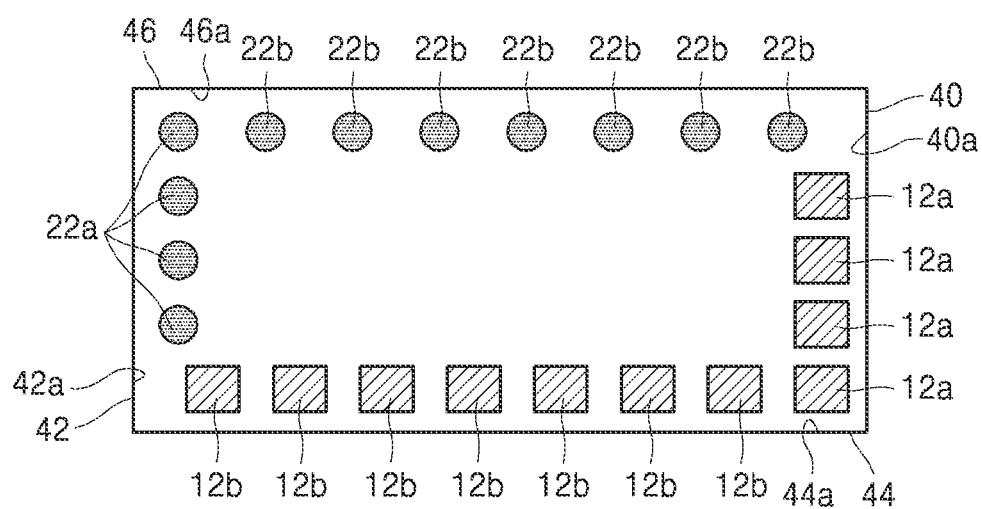

Referring to FIG. 7A, the electrodes 12a are arranged adjacent to the left side 40 edge 40a of the semiconductor device 10, and the electrodes 12b may be arranged adjacent to the upper side 44 edge 44a. The lowermost electrode of the electrodes 12a adjacent to the left side 40 edge 40a may be separated by a predetermined distance from the lower side 46 edge 46a. For example, a gap between the lowermost electrode of the electrodes 12a adjacent to the left side 40 and the lower side 46 edge 46a may be greater than a sum of the width of the electrodes 12b on the upper side 44 and a gap between the electrodes 12b on the upper side 44 and the upper side 44 edge 44a. As illustrated in FIG. 7B, if the semiconductor device 10 is inaccurately mounted on the system 20, the locations of the electrodes 12a and 12b and the electrode pads 22a and 22b will not be consistent with each other.

Figure 8A:
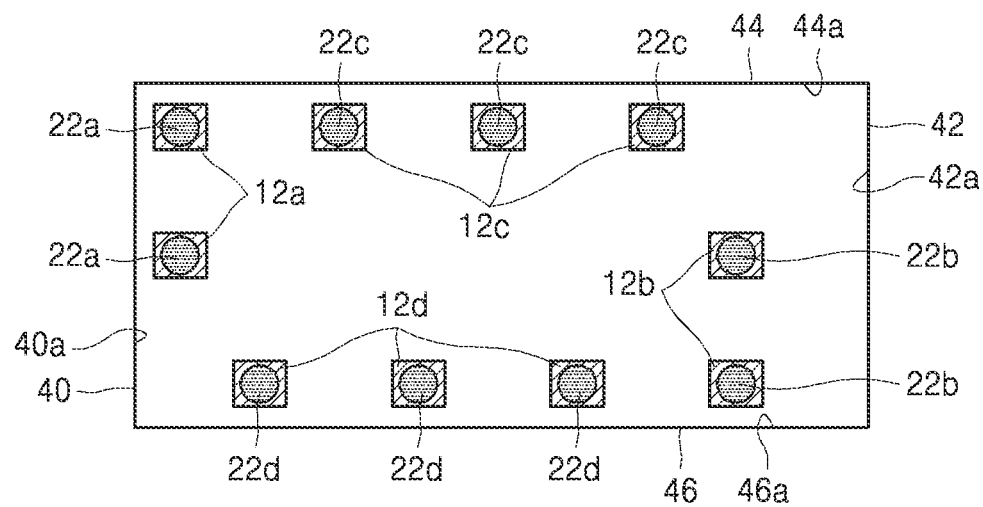
Figure 8B:
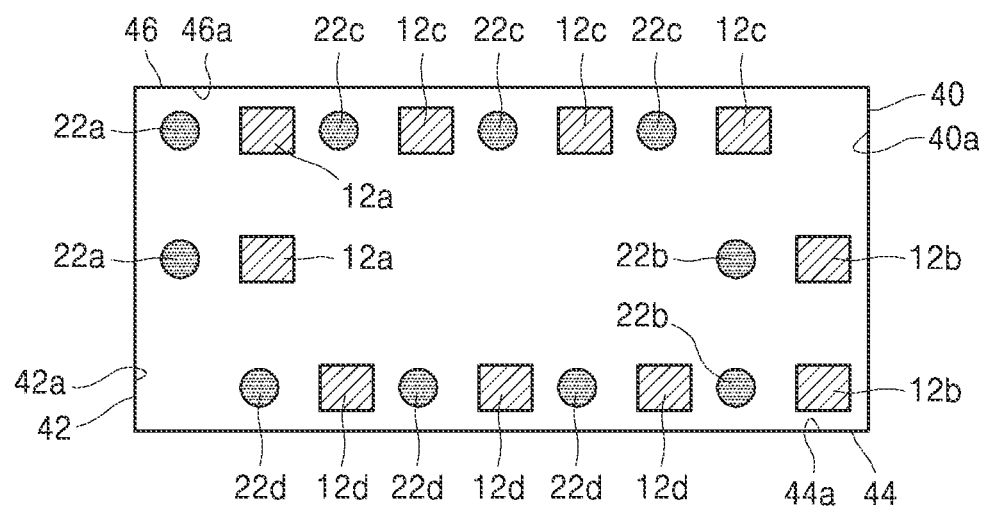

Referring to FIGS. 8A and 8B, a plurality of electrodes 12a, 12b, 12c, and 12d may be arranged along all side edges 40a, 42a, 44a and 46a of the semiconductor device 10 that has a rectangular shape. As described above, a gap between the right electrodes 12b and the right side 42 edge 42a may be greater than a sum of the width of the left electrodes 12a and a gap between the left electrodes 12a and the left side 40 edge 40a. Also, the electrodes 12c on the upper side 44 edge 44a may be arranged not to directly face the electrodes 12d on the lower side 46 edge 46a. If the semiconductor device 10 is inaccurately mounted on the system 20, as illustrated in FIG. 8B, the locations of the electrodes 12a, 12b, 12c, and 12d and a plurality of electrode pads 22a, 22b, 22c, and 22d will be inconsistent with each other.

In addition, the electrodes 12c arranged on the upper side 44 edge 44a may be arranged to directly face the electrodes 12d on the lower side 46 edge 46a, instead of arranging the electrodes 12c on the upper side 44 edge 44a not to directly face the electrodes 12d on the lower side 46 edge 46a. In this case, a gap between the electrodes 12c on the upper side 44 and the upper side 44 edge 44a may be greater than a sum of the width of the electrodes 12d on the lower side 46 edge 46a and a gap between the electrodes 12d on the lower side 46 and the lower side 46 edge 46a.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. A semiconductor device comprising:
a semiconductor structure configured to perform a predetermined function; and
a plurality of electrodes arranged on the semiconductor structure,
wherein:
the plurality of electrodes are asymmetrically arranged in at least one of a first direction and a second direction;
the second direction is perpendicular to the first direction;
the semiconductor structure includes an upper surface opposite a lower surface, a first side and a second side facing each other in the first direction, and a third side and a fourth side facing each other in the second direction;
the plurality of electrodes comprise a plurality of first electrodes arranged on the upper surface along an edge of the first side and a plurality of second electrodes arranged on the upper surface along an edge of the second side; and
a gap between the edge of the second side and the plurality of second electrodes is greater than a sum of a width of one of the first electrodes and a gap between the first electrodes and the edge of the first side.

2. A semiconductor device comprising:
a semiconductor structure configured to perform a predetermined function; and
a plurality of electrodes arranged on the semiconductor structure,
wherein:
the plurality of electrodes are asymmetrically arranged in at least one of a first direction and a second direction;
the second direction is perpendicular to the first direction;
the semiconductor structure includes an upper surface opposite a lower surface, a first side and a second side facing each other in the first direction, and a third side and a fourth side facing each other in the second direction;
the plurality of electrodes comprise a plurality of first electrodes arranged on the upper surface along an edge of the first side and a plurality of third electrodes arranged on the upper surface along an edge of the third side; and
a gap between an electrode of the plurality of third electrodes that is closest to the second side and an edge of the second side is greater than a sum of a width of one of the plurality of first electrodes and a gap between the plurality of first electrodes and the edge of the first side.

3. A semiconductor device comprising:
a semiconductor structure configured to perform a predetermined function; and
a plurality of electrodes arranged on the semiconductor structure,
wherein:
the plurality of electrodes are asymmetrically arranged in at least one of a first direction and a second direction;
the second direction is perpendicular to the first direction;
the semiconductor structure includes an upper surface opposite a lower surface, a first side and a second side facing each other in the first direction, and a third side and a fourth side facing each other in the second direction;
the plurality of electrodes comprise a plurality of first electrodes arranged on the upper surface along an edge of the first side and a plurality of third electrodes arranged on the upper surface along an edge of the third side; and
a gap between an electrode of the plurality of first electrodes that is closest to the fourth side and an edge of the fourth side is greater than a sum of a width of one of the plurality of third electrodes and a gap between the plurality of third electrodes and the edge of the third side.

4. A semiconductor device comprising:
a semiconductor structure configured to perform a predetermined function; and
a plurality of electrodes arranged on the semiconductor structure,
wherein:
the plurality of electrodes are asymmetrically arranged in at least one of a first direction and a second direction;
the second direction is perpendicular to the first direction;
the semiconductor structure includes an upper surface opposite a lower surface, a first side and a second side facing each other in the first direction, and a third side and a fourth side facing each other in the second direction;
the plurality of electrodes comprise a plurality of first electrodes arranged on the upper surface in a first column and a plurality of second electrodes arranged on the upper surface in a second column; and the first column and the second column are arranged in parallel along an edge of any one of the first side, the second side, the third side and the fourth side.

5. A semiconductor device comprising:
a semiconductor structure configured to perform a predetermined function; and
a plurality of electrodes arranged on the semiconductor structure,
wherein:
the plurality of electrodes are asymmetrically arranged in at least one of a first direction and a second direction;
the second direction is perpendicular to the first direction;
the semiconductor structure includes an upper surface opposite a lower surface, a first side and a second side facing each other in the first direction, and a third side and a fourth side facing each other in the second direction;
the plurality of electrodes comprise a plurality of first electrodes arranged on the upper surface along an edge of the first side, a plurality of second electrodes arranged on the upper surface along an edge of the second side, a plurality of third electrodes arranged on the upper surface along an edge of the third side, and a plurality of fourth electrodes arranged on the upper surface along an edge of the fourth side; and
a gap between the edge of the second side and the plurality of second electrodes is greater than a sum of a width of one of the plurality of first electrodes and a gap between the plurality of first electrodes and the edge of the first side.

6. A semiconductor device comprising:
a semiconductor structure configured to perform a predetermined function; and
a plurality of electrodes arranged on the semiconductor structure,
wherein:
the plurality of electrodes are asymmetrically arranged in at least one of a first direction and a second direction;
the second direction is perpendicular to the first direction;
the semiconductor structure includes an upper surface opposite a lower surface, a first side and a second side facing each other in the first direction, and a third side and a fourth side facing each other in the second direction;
the plurality of electrodes comprise a plurality of first electrodes arranged on the upper surface along an edge of the first side, a plurality of second electrodes arranged on the upper surface along an edge of the second side, a plurality of third electrodes arranged on the upper surface along an edge of the third side, and a plurality of fourth electrodes arranged on the upper surface along an edge of the fourth side; and
a gap between the edge of the fourth side and the plurality of fourth electrodes is greater than a sum of a width of one of the plurality of third electrodes and a gap between the plurality of third electrodes and the edge of the third side.

7. A microheater comprising:
a semiconductor device including:
a semiconductor structure configured to perform a predetermined function, the semiconductor structure including an upper surface opposite a lower surface, a first side and a second side facing each other in a first direction, and a third side and a fourth side facing each other in a second direction;

first, third, and fifth electrodes arranged on the upper surface along an edge of the first side on the semiconductor structure; and
second, fourth, and sixth electrodes arranged on the upper surface along an edge of the second side on the semiconductor structure;
a metal thermal line connected between the first electrodes and the second electrodes in a zigzag pattern;
a variable resistive element positioned around a center of the semiconductor structure;
a first wiring connected between the third electrodes and the variable resistive element;
a second wiring connected between the fourth electrodes and the variable resistive element;
a third wiring connected between the fifth electrodes and the variable resistive element; and
a fourth wiring connected between the sixth electrodes and the variable resistive element;
wherein:
the first, second, third, fourth, fifth and sixth electrodes are asymmetrically arranged in at least one of the first direction and the second direction; and
the second direction is perpendicular to the first direction.

8. The microheater of claim 7, wherein a gap between the edge of the second side and the second, fourth, and sixth electrodes is greater than a sum of a width of one of the first, third, and fifth electrodes and a gap between the edge of the first side and the first, third, and fifth electrodes.

9. A system for accurately mounting a semiconductor device, the system comprising:
a semiconductor structure configured to perform a predetermined function;
a plurality of electrodes asymmetrically arranged on the semiconductor structure in at least one of a first direction and a second direction perpendicular to the first direction;
a semiconductor support structure configured to support the semiconductor structure; and
a plurality of electrode pads arranged asymmetrically to correspond to the plurality of electrodes, wherein:
the semiconductor structure comprises an upper surface, a first side and a second side facing each other in the first direction, and a third side and a fourth side facing each other in the second direction;
the plurality of electrodes comprise a plurality of electrodes arranged on the upper surface along an edge of the first side and a plurality of electrodes arranged on the upper surface along an edge of the second side; and
a gap between the edge of the second side and the plurality of second electrodes is greater than a sum of a width of one of the first electrodes and a gap between the first electrodes and the edge of the first side.

10. The system of claim 9, wherein the semiconductor support structure is one of a circuit board in an electronic apparatus and a lead frame of a semiconductor chip package.

11. A semiconductor device comprising:
a rectangular semiconductor structure including an upper surface, a first side and a second side facing each other in a first direction and a third and a fourth side facing each other in a second direction perpendicular to the first direction;
a plurality of first electrodes arranged on the upper surface along an edge of the first side; and
(i) a plurality of second electrodes arranged on the upper surface along an edge of the second side, wherein a gap between the plurality of second electrodes and the edge of the second side is greater than a sum of a width of one of the plurality of first electrodes and a gap between the plurality of first electrodes and the edge of the first side;

or (ii) a plurality of second electrodes arranged on the upper surface along an edge of the third side, wherein a gap between the plurality of second electrodes and the edge of the third side is greater than a sum of a width of one of the plurality of first electrodes and a gap between the plurality of first electrodes and the edge of the first side.

* * * * *